(12) United States Patent
Lin et al.

(10) Patent No.: US 12,742,740 B2
(45) Date of Patent: Sep. 22, 2026

(54) BATTERY WETTING STATE DETECTION METHOD AND APPARATUS, DEVICE, SYSTEM, AND MEDIUM

(71) Applicant: CONTEMPORARY AMPEREX TECHNOLOGY (HONG KONG) LIMITED, Hong Kong (CN)

(72) Inventors: Si Lin, Ningde (CN); Shaoteng Ren, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 430 days.

(21) Appl. No.: 18/223,552

(22) Filed: Jul. 19, 2023

(65) Prior Publication Data

US 2024/0053283 A1 Feb. 15, 2024

Related U.S. Application Data

(63) Continuation of application No. PCT/CN2022/112202, filed on Aug. 12, 2022.

(51) Int. Cl.

*G01N 23/046* (2018.01)
*G01N 23/02* (2006.01)
*G01R 31/385* (2019.01)
*H01M 10/44* (2006.01)

(52) U.S. Cl.

CPC ......... *G01N 23/046* (2013.01); *G01N 23/025* (2013.01); *G01R 31/3865* (2019.01); *H01M 10/44* (2013.01); *G01N 2223/401* (2013.01)

(58) Field of Classification Search

CPC ............... G01N 23/046; G01N 23/025; G01N 2223/401; G01R 31/3865; H01M 10/44

USPC ........................................................ 382/128

See application file for complete search history.

(56) References Cited

U.S. PATENT DOCUMENTS

| | | | | |
|---|---|---|---|---|
| 7,550,737 | B1 * | 6/2009 | Ballard | G01N 23/046 250/390.06 |
| 11,600,870 | B2 * | 3/2023 | Dou | G01N 29/262 |
| 2022/0359856 | A1 * | 11/2022 | Ko | H01M 10/0525 |

FOREIGN PATENT DOCUMENTS

| | | | | |
|---|---|---|---|---|
| CN | 102027355 A | | 4/2011 | |
| CN | 109565089 A | | 4/2019 | |
| CN | 110380124 A | | 10/2019 | |
| CN | 112285137 A | | 1/2021 | |
| CN | 112697649 A | * | 4/2021 | G01N 21/84 |
| CN | 114072952 A | | 2/2022 | |

(Continued)

OTHER PUBLICATIONS

Bommier, Clement et al. In Operando Acoustic Detection of Lithium Metal Plating in Commercial LiCoO2/Graphite Pouch Cells. Cell Reports Physical Science, vol. 1, Issue 4, 100035 (Year: 2020).*

(Continued)

*Primary Examiner* — Jennifer Mehmood
*Assistant Examiner* — Eric James Shoemaker
(74) *Attorney, Agent, or Firm* — XSENSUS LLP

(57) ABSTRACT

This application provides a battery wetting state detection method and apparatus, a device, a system, and a medium and pertains to the field of battery technologies. The detection method may include: obtaining a three-dimensional tomographic image of a battery through neutron imaging; and determining a wetting state of the battery based on the three-dimensional tomographic image.

19 Claims, 9 Drawing Sheets

Obtain a three-dimensional tomographic image of a battery through neutron imaging — S101

Determine a wetting state of the battery based on the three-dimensional tomographic image — S102

(56) References Cited

FOREIGN PATENT DOCUMENTS

| | | | | |
|---|---|---|---|---|
| JP | 2019-015638 A | 1/2019 | | |
| WO | WO-2017223219 A1 * | 12/2017 | ......... | G01N 29/4436 |

OTHER PUBLICATIONS

Ziesche et al. 4D imaging of lithium-batteries using correlative neutron and X-ray tomography with a virtual unrolling technique. Nat Commun 11, 777 (Year: 2020).*
Pietsch. Wood. X-Ray Tomography for Lithium Ion Battery Research: A Practical Guide. Annual Review of Materials Research. vol. 47:451-479 (Year: 2017).*
Knoche et al. In situ visualization of the electrolyte solvent filling process by neutron radiography. Journal of Power Sources. 331. 267-276. (Year: 2016).*
Rüegsegger , P., Koller, B. & Müller, R. A microtomographic system for the nondestructive evaluation of bone architecture. Calcif Tissue Int 58, 24-29 (1996). https://doi.org/10.1007/BF02509542 (Year: 1996).*
Waleed Abd el Bar, Imbaby I. Mahmoud, Hussein A. Konber. Development and characterization of a neutron tomography system for a Research Reactor. Journal of Taibah University for Science. vol. 10. Issue 2. pp. 195-204. ISSN 1658-3655. https://doi.org/10.1016/j.jtusci.2015.03.002. (Year: 2016).*
Dong Hyup Jeon. Wettability in electrodes and its impact on the performance of lithium-ion batteries. Energy Storage Materials vol. 18, Mar. 2019, pp. 139-147. https://doi.org/10.1016/j.ensm.2019.01.002 (Year: 2019).*
International Search Report mailed on Dec. 20, 2022, received for PCT Application PCT/CN2022/112202, filed on Aug. 12, 2022, 6 pages including English Translation.
Song-Bai et al., "Application of Thermal Neutron Radiography for Research in Lithium-Ion Battery", NDT, China Academic Journal Electronic Publishing House, 2012, pp. 55-59 (5 pages including English Abstract).
Communication pursuant to Article 94(3) EPC issued Jul. 17, 2024 in European Patent Application No. 22922573.5.
B. Michalak et al., "Gas Evolution in Operating Lithium-Ion Batteries Studied In Situ by Neutron Imaging", Scientific Reports, vol. 5, No. 1, Oct. 26, 2015, XP093181779, ISSN: 2045-2322, DOI: 10.1038/srep15627.
Extended European Search Report issued Dec. 15, 2023 in European Patent Application No. 22922573.5.
Ziesche, et al,. "Editors' Choice-4D Neutron and X-ray Tomography Studies of High Energy Density Primary Batteries: Part II. Multi-Modal Microscopy of LiSOCl2 Cells", Journal of the Electrochemical Society, vol. 167, No. 14, Oct. 19, 2020, p. 140509, XP093107885, ISSN: 0013-4651, DOI: 10.1149/1945-7111/abbfd9.
Ziesche, et al., "4D imaging of lithium-batteries using correlative neutron and X-ray tomography with a virtual unrolling technique", Nature Communications, vol. 11, No. 1, Feb. 7, 2020, XP093107784, ISSN: 2041-1723, DOI: 10.1038/s41467-019-13943-3.
Habedank, et al., "Rapid electrolyte wetting of lithium-ion batteries containing laser structured electrodes: in situ visualization by neutron radiography", The International Journal of Advanced Manufacturing Technology, Springer, London, vol. 102, No. 9, Feb. 6, 2019, pp. 2769-2778, XP036790880, ISSN: 0268-3768, DOI: 10.1007/S00170-019-03347-4.
Office Action issued May 21, 2026 in Chinese Patent Application No. 202280006721.6 with English translation thereof.
Thomas Knoche, et al., "In situ visualization of the electrolyte solvent filling process by neutron radiography", Journal of Power Sources, No. 331, pp. 267-276, Nov. 1, 2016.

* cited by examiner

BATTERY WETTING STATE DETECTION METHOD AND APPARATUS, DEVICE, SYSTEM, AND MEDIUM

CROSS-REFERENCE TO RELATED APPLICATION

The present application is a continuation of International Application No. PCT/CN2022/112202, filed Aug. 12, 2022, which is incorporated herein by reference in its entirety.

TECHNICAL FIELD

This application relates to the field of battery technologies, and in particular, to a battery wetting state detection method and apparatus, a device, a system, and a medium.

BACKGROUND

Energy saving and emission reduction are crucial to the sustainable development of the automotive industry. Electric vehicles, with their advantages in energy conservation and emission reduction, have become an important part of sustainable development of the automobile industry. For electric vehicles, battery technology is an important factor in connection with their development.

The wetting process after injection of electrolyte into a battery has an extremely important influence on the battery performance. Inadequate wetting may lead to lithium precipitation on a negative electrode plate, which affects the service life and energy density of the battery and also poses serious potential safety hazards. In order to ensure the safe use of the battery, it is necessary to check the battery wetting state.

SUMMARY

This application aims to solve at least one of the technical problems in the background. Therefore, one objective of this application is to provide a battery wetting state detection method and apparatus, a device, a system, and a medium, so as to solve the problems in the related art.

Embodiments of a first aspect of this application provide a battery wetting state detection method. The method includes: obtaining a three-dimensional tomographic image of a battery through neutron imaging; and determining a wetting state of the battery based on the three-dimensional tomographic image.

In the technical solution of the embodiments of this application, neutrons without electricity can pass through an electron layer to react with light elements such as hydrogen (H) and lithium (Li), and all regions inside the battery that are wet by electrolyte react with neutrons, which makes it possible to implement the electrolyte wetting state distribution test through neutron imaging, thus detecting the wetting state of the battery.

In some embodiments, the obtaining a three-dimensional tomographic image of a battery through neutron imaging includes: obtaining a plurality of two-dimensional tomographic images respectively corresponding to a plurality of orientations of the battery through neutron imaging; and obtaining the three-dimensional tomographic image based on the plurality of two-dimensional tomographic images. The plurality of two-dimensional tomographic images corresponding to a plurality of orientations of the battery are obtained first, and in subsequent use, a desired image can be selected directly from the plurality of two-dimensional tomographic images for analysis. Alternatively, the plurality of two-dimensional tomographic images are fused to obtain a desired three-dimensional tomographic image. This avoids errors caused by inaccuracies in one of the two-dimensional tomographic images, improving accuracy.

In some embodiments, the obtaining a plurality of two-dimensional tomographic images respectively corresponding to a plurality of orientations of the battery includes: controlling the battery to rotate, where a rotation axis of the battery is located between two electrode terminals of the battery, and the rotation axis extends in a first direction; and controlling a neutron camera to photograph the rotating battery at a given frequency in a second direction to obtain the plurality of two-dimensional tomographic images respectively corresponding to the plurality of orientations of the battery; where the second direction intersects with the first direction. The battery is controlled to rotate and neutron imaging is performed during the rotation of the battery so that the plurality of two-dimensional tomographic images corresponding to the plurality of orientations of the battery can be easily obtained.

In some embodiments, before the obtaining a three-dimensional tomographic image of a battery through neutron imaging, the method further includes performing charge-discharge cycling on the battery. The charge-discharge cycling is performed on the battery by simulating an actual charge-discharge process of the battery, so that the wetting state of the battery in the use process can be detected. In this way, any instances of unqualified battery wetting state can be promptly detected, thus avoiding safety problems.

In some embodiments, the method further includes: obtaining a plurality of three-dimensional tomographic images of the battery at a plurality of life degradation stages during the charge-discharge cycling process through neutron imaging; and determining a wetting state of the battery in a life cycle based on the plurality of three-dimensional tomographic images. As the wetting state of the battery may change during its use, using this method to determine the wetting state of the battery in the life cycle is beneficial in ensuring subsequent safe operation of the battery during its use.

In some embodiments, the obtaining a plurality of three-dimensional tomographic images of the battery at a plurality of life degradation stages during the charge-discharge cycling process including: obtaining a plurality of cycles in the charge-discharge cycling of the battery, where the plurality of cycles are in one-to-one correspondence with the plurality of life degradation stages of the battery; and obtaining a plurality of three-dimensional tomographic images of the battery respectively corresponding to the plurality of cycles implemented in the charge-discharge cycling. It is more convenient to determine the life degradation stage of the battery by controlling the number of charge-discharge cycles of the battery.

In some embodiments, the performing charge-discharge cycling on the battery includes: charging the battery to implement charge formation of the batten; and controlling the battery after charge formation to run a plurality of charge-discharge cycles so that the battery reaches different life degradation stages. The battery after charge formation is electrochemically active, which facilitates subsequent detection of the wetting state of the battery through neutron imaging.

In some embodiments, each of the plurality of charge-discharge cycles includes: discharging the battery at a constant current to make a terminal voltage of the battery be a first voltage; charging the battery that has undergone the constant-current discharging, at a constant current to make a terminal voltage of the battery be a second voltage, the second voltage being greater than the first voltage; and charging the battery that has undergone the constant-current charging, at a constant voltage to make an internal current of the battery be a cutoff current. An actual charge-discharge process of the battery is simulated.

In some embodiments, before the charging, at a constant current, the battery that has undergone the constant-current discharging, each of the charge-discharge cycles further includes letting the battery that has undergone the constant-current discharging rest. After the battery is discharged, the battery is let to rest for a period of time to simulate battery rest in actual use so as to ensure accuracy.

In some embodiments, each of the charge-discharge cycles further includes letting the battery that has undergone the constant-voltage charging rest. After the battery is charged, the battery is let to rest for a period of time to simulate battery rest in actual use so as to ensure accuracy.

In some embodiments, temperature of the battery in each charge-discharge cycle is greater than or equal to 50 degrees Celsius and less than or equal to 70 degrees Celsius. The aging of the battery can be accelerated so as to reduce the experiment time and improve operating efficiency.

In some embodiments, the determining a wetting state of the battery based on the three-dimensional tomographic image includes: determining a wet region of the battery based on the three-dimensional tomographic image; and determining the wetting state of the battery based on the wet region. The wet region of the battery can be clearly determined based on the three-dimensional tomographic image, thereby determining the wetting state of the battery.

In some embodiments, the determining a wet region of the battery based on the three-dimensional tomographic image includes: enhancing the three-dimensional tomographic image to obtain a first intermediate image; denoising the first intermediate image to obtain a second intermediate image; and filtering the second intermediate image to obtain the wet region of the battery. The three-dimensional tomographic image is enhanced, denoised, and filtered to ensure that the wet region obtained is more accurate.

In some embodiments, the determining the wetting state of the battery based on the wet region includes: determining a wet area percentage based on the wet region; and determining the wetting state of the battery based on the wet area percentage. The wetting state of the battery can be quickly determined based on the wet area percentage of the battery.

In some embodiments, the determining the wetting state of the battery based on the wet area percentage includes: determining, in response to the wet area percentage being less than a wet area threshold, that the wetting state of the battery is unqualified; and determining, in response to the wet area percentage being greater than or equal to the wet area threshold, that the wetting state of the battery is qualified. With such a simple judgment criterion, the wetting state of the battery can be quickly determined.

Embodiments of a second aspect of this application provide a battery wetting state detection apparatus. The apparatus includes: an obtaining module configured to obtain a three-dimensional tomographic image of a battery through neutron imaging; and a determining module configured to determine a wetting state of the battery based on the three-dimensional tomographic image.

Embodiments of a third aspect of this application provide an electronic device. The electronic device includes at least one processor and a memory communicatively connected to the at least one processor. The memory stores instructions executable by the at least one processor, and the instructions are executed by the at least one processor to enable the at least one processor to perform the battery wetting state detection method according to any one of the foregoing embodiments.

Embodiments of a fourth aspect of this application provide a battery management system including the electronic device in the foregoing embodiments.

Embodiments of a fifth aspect of this application provide a computer readable storage medium storing a computer program. When the computer program is executed by a processor, the battery wetting state detection method according to any one of the foregoing embodiments is implemented.

Embodiments of a sixth aspect of this application provide a computer program product including a computer program. When the computer program is executed by a processor, the battery wetting state detection method according to any one of the foregoing embodiments is implemented.

The foregoing description is merely an overview of the technical solution of this application. For a better understanding of the technical means in this application such that they can be implemented according to the content of the specification, and to make the above and other objectives, features and advantages of this application more obvious and easier to understand, the following describes specific embodiments of this application.

BRIEF DESCRIPTION OF DRAWINGS

In the accompanying drawings, unless otherwise specified, identical reference signs in a plurality of the accompanying drawings denote identical or similar parts or elements. These accompanying drawings are not necessarily drawn to scale. It should be understood that these accompanying drawings illustrate only some embodiments disclosed according to this application and should not be considered as limitations on the scope of this application.

DESCRIPTION OF EMBODIMENTS

Figure 1:
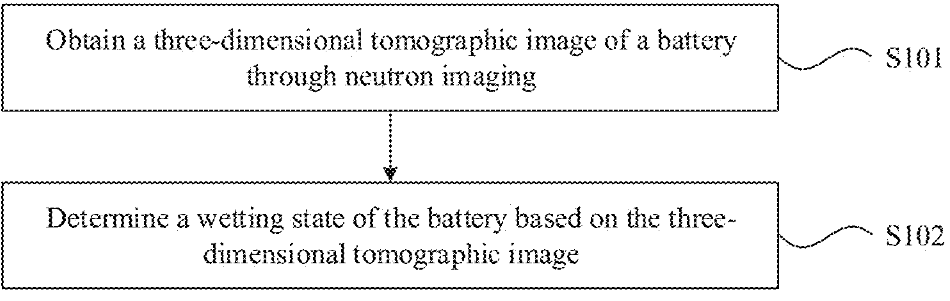
FIG. 1 is a flowchart of a battery wetting state detection method according to some embodiments of this application.

The following describes in detail the embodiments of technical solutions of this application with reference to the accompanying drawings. The following embodiments are merely intended for a clearer description of the technical solutions of this application and therefore are used as just examples which do not constitute any limitations on the protection scope of this application.

Unless otherwise defined, all technical and scientific terms used herein shall have the same meanings as commonly understood by those skilled in the art to which this application relates. The terms used herein are intended to merely describe the specific embodiments rather than to limit this application. The terms "include", "comprise", and "have" and any other variations thereof in the specification, claims and brief description of drawings of this application are intended to cover non-exclusive inclusions.

In the description of the embodiments of this application, the terms "first", "second" and the like are merely intended to distinguish between different objects, and shall not be understood as any indication or implication of relative importance or any implicit indication of the number, sequence or primary-secondary relationship of the technical features indicated. In the description of this application, "a plurality of" means at least two unless otherwise specifically stated.

In this specification, reference to "embodiment" means that specific features, structures or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

In the description of the embodiments of this application, the term "a plurality of" means more than two (inclusive). Similarly, "a plurality of groups" means more than two (inclusive) groups, and "a plurality of pieces" means more than two (inclusive) pieces.

In the description of the embodiments of this application, the orientations or positional relationships indicated by the technical terms "center", "longitudinal", "transverse", "length", "width", "thickness". "upper", "lower", "front", "rear", "left", "right", "perpendicular", "horizontal", "top", "bottom", "inside", "outside", "clockwise", "counterclockwise", "axial", "radial", "circumferential", and the like are based on the orientations or positional relationships as shown in the accompanying drawings. These terms are merely for ease and brevity of description of the embodiments of this application rather than indicating or implying that the apparatuses or components mentioned must have specific orientations or must be constructed or manipulated according to specific orientations, and therefore shall not be construed as any limitations on embodiments of this application.

In the description of the embodiments of this application, unless otherwise specified and defined explicitly, the terms "mount", "connect", "join", and "fasten" should be understood in their general senses. For example, they may be a fixed connection, a detachable connection, or an integral connection may be a mechanical connection or electrical connection or may be a direct connection, an indirect connection via an intermediate medium, or communication between two elements or an interaction between two elements. Persons of ordinary skill in the art can understand specific meanings of these terms in this application as appropriate to specific situations.

Currently, from a perspective of market development, application of traction batteries is becoming more and more extensive. Traction batteries have been widely used in energy storage power supply systems such as hydroelectric power plants, thermal power plants, wind power plants, and solar power plants, and many other fields including electric transportation tools such as electric bicycles, electric motorcycles, and electric vehicles, military equipment, and aerospace. With continuous expansion of application fields of traction batteries, market demands for the traction batteries are also expanding.

The applicant has noted that the battery is mainly composed of a positive electrode, a negative electrode, a separator, an electrolyte, and structural parts. Inside the battery, the positive and negative electrodes are connected through the electrolyte. From a microscopic point of view, the positive electrode, the negative electrode, and the separator are similar to a honeycomb porous structure with the electrolyte filled. Electrolyte wetting distribution in the battery affects the electrical performance and safety performance of lithium batteries. In a case that the wetting is poor, lithium ion movement inside the battery is blocked, lithium ion migration path becomes longer and thus affects the rate performance, resulting in an increased internal resistance of the battery. With the charging and discharging proceeding, lithium precipitation may occur in a region unwet by the electrolyte, which not only leads to rapid capacity degradation but also may cause safety problems due to lithium dendrites piercing the separator.

At a battery production stage, the wetting time is generally extended to ensure adequate wetting by the electrolyte, but this method increases the cost of battery production. At a battery testing stage, disassembly is generally performed to confirm the changes of the electrolyte inside the battery during charging and discharging, but manual disassembly is inefficient and may be destructive such that an accurate electrolyte wetting state cannot be obtained.

The applicant has found through research that the electrolyte contains light elements such as H and Li and accordingly proposed a battery wetting state detection method. The method includes: obtaining a three-dimensional tomographic image of a battery through neutron imaging; and determining a wetting state of the battery based on the three-dimensional tomographic image. Neutrons without electricity can easily penetrate the electron layer to have nuclear reactions with the nucleus, and neutrons are insensitive to heavy elements but sensitive to light elements such as H and Li. The electrolyte contains light elements such as H and Li, and therefore, the electrolyte wetting state distribution test can be easily implemented through neutron imaging, so as to detect the wetting state of the battery.

Some embodiments of this application provide a battery wetting state detection method. FIG. 1 is a flowchart of the battery wetting state detection method according to some embodiments of this application. Referring to FIG. 1, the method includes the following steps.

Step S101: Obtain a three-dimensional tomographic image of a battery through neutron imaging.

Step S102: Determine a wetting state of the battery based on the three-dimensional tomographic image.

In the embodiments of this application, a neutron camera can be used to photograph the battery, so as to obtain the three-dimensional tomographic image of the battery. As neutrons can penetrate the electron layer to have nuclear reactions with the nucleus, a three-dimensional tomographic image of the interior of the battery can be obtained through neutron imaging. The electrolyte contains light elements such as H and Li, and accordingly, a region wet by the electrolyte contains light elements such as H and Li. Therefore, a region inside the battery wet by the electrolyte can be seen from the three-dimensional tomographic image, thus determining the wetting state of the battery.

A tomographic image is a clear two-dimensional or three-dimensional image reflecting the interior of an object obtained using a computer image reconstruction method. The computer image reconstruction method is implemented by receiving physical signals, where the physical signals are transmitted outside the object, run through the object, and carry internal information of the object. In the embodiments of this application, the computer image reconstruction method is used to obtain a clear three-dimensional image of the interior of the battery. In this method, neutrons are emitted outside the battery, and then the neutrons run through the battery and carry internal information of the battery and then are received.

In the embodiments of this application, neutrons without electricity can pass through the electron layer to react with light elements such as H and Li. All regions inside the battery that are wet by electrolyte react with neutrons, facilitating implementation of the electrolyte wetting state distribution test through neutron imaging, and thus detecting the wetting state of the battery.

Figure 2:
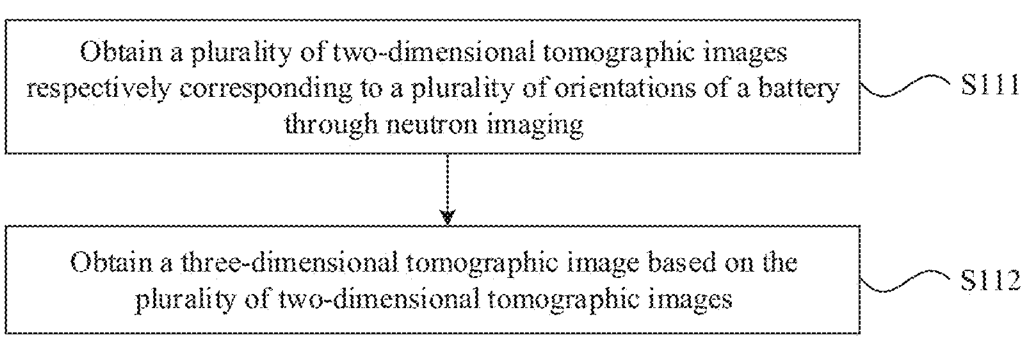
FIG. 2 is a flowchart of a battery wetting state detection method according to some embodiments of this application.

According to some embodiments of this application, FIG. 2 is a flowchart of the battery wetting state detection method according to some embodiments of this application. Referring to FIG. 2, step S101 includes the following steps.

Step S111: Obtain a plurality of two-dimensional tomographic images respectively corresponding to a plurality of orientations of the battery through neutron imaging.

Step S112: Obtain the three-dimensional tomographic image based on the plurality of two-dimensional tomographic images.

In the embodiments of this application, the battery can be photographed from a plurality of orientations of the battery through neutron imaging, so as to obtain the plurality of two-dimensional tomographic images corresponding to the plurality of orientations of the battery. One orientation corresponds to one two-dimensional tomographic image.

In the embodiments of this application, a neutron camera is used to photograph the battery to obtain the two-dimensional tomographic images of the battery, and a direction in which the neutron camera photographs the battery corresponds to an orientation. For example, a line connecting two electrode terminals of the battery is a first connecting line, an orientation corresponding to an included angle 0 degrees (°) between a photographing direction and the first connecting line is an initial orientation, and different included angles between a photographing direction and the first connecting line correspond to different orientations. The included angle between a photographing direction and the first connecting line is greater than or equal to 0° and less than or equal to 360°.

In the embodiments of this application, a plurality of two-dimensional tomographic images respectively corresponding to a plurality of orientations of the battery are obtained first, and in subsequent use, a desired image can be selected directly from the plurality of two-dimensional tomographic images for analysis. Alternatively, the plurality of two-dimensional tomographic images are fused to obtain a desired three-dimensional tomographic image. This avoids errors caused by inaccuracies in one of the two-dimensional tomographic images, improving accuracy.

Figure 3:
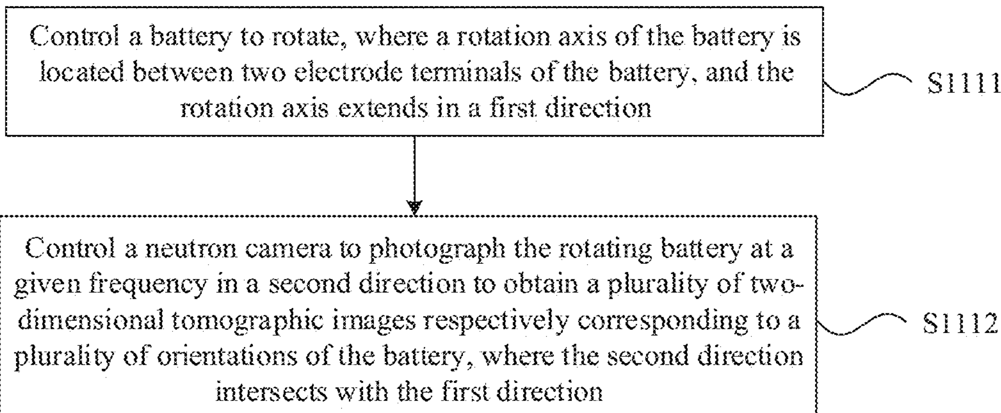
FIG. 3 is a flowchart of a battery wetting state detection method according to some embodiments of this application.

According to some embodiments of this application, FIG. 3 is a flowchart of the battery wetting state detection method according to some embodiments of this application. Referring to FIG. 3, step S111 includes the following steps.

Step S1111: Control the battery to rotate, where a rotation axis of the battery is located between two electrode terminals of the battery, and the rotation axis extends in a first direction X.

Step S1112: Control a neutron camera to photograph the rotating battery at a given frequency in a second direction to obtain the plurality of two-dimensional tomographic images respectively corresponding to the plurality of orientations of the battery, where the second direction Y intersects with the first direction X.

Figure 4:
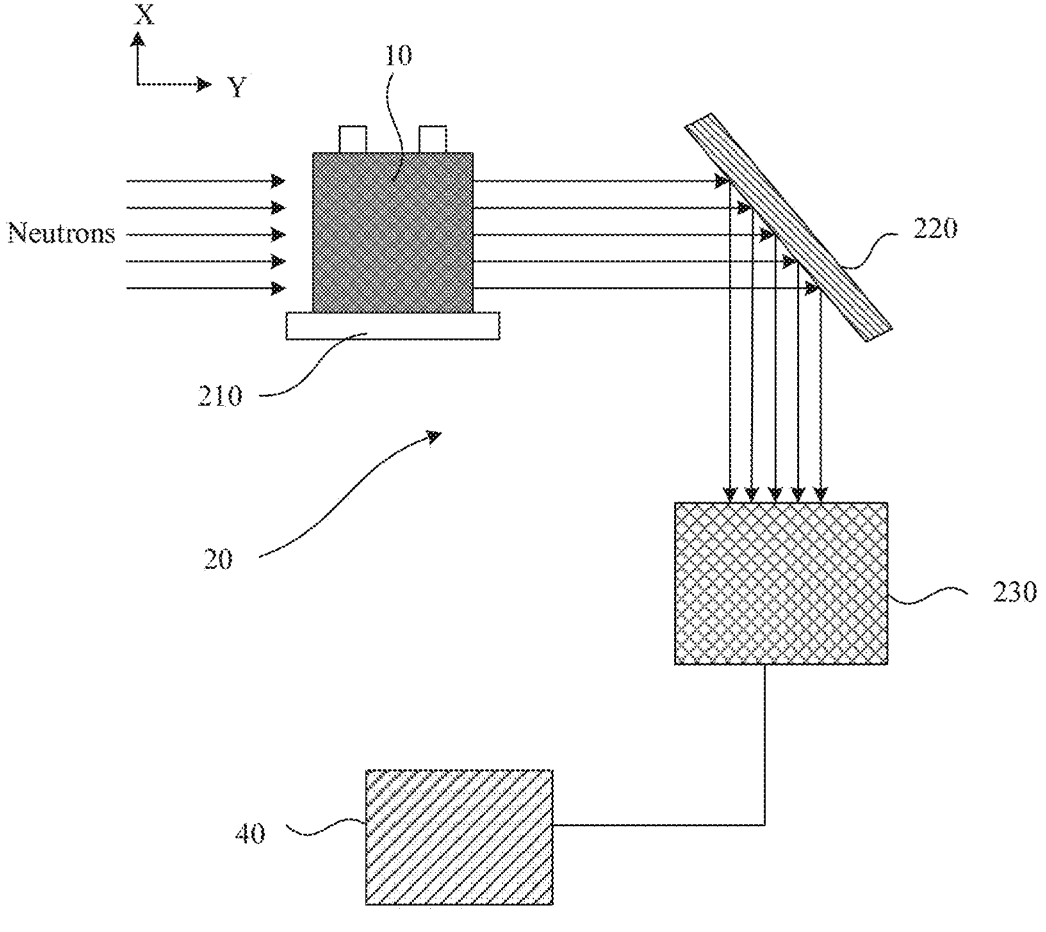
FIG. 4 is a simple schematic diagram of a neutron camera according to some embodiments of this application.

For orientations of the first direction X and the second direction Y, refer to FIG. 4.

FIG. 4 is a simple schematic diagram of a neutron camera according to some embodiments of this application. Referring to FIG. 4, a battery 10 is located on a turntable 210 of the neutron camera 20, and the turntable 210 can rotate around its central axis. The turntable 210 rotates to drive the battery 10 to rotate, and when the battery 10 rotates, the neutron camera 20 emits neutrons to the battery 10. The neutrons are reflected by a reflector 220 after passing through the battery 10 and finally captured by a charge coupled device (Charge Coupled Device, CCD) image acquisition apparatus 230, then the CCD image acquisition apparatus 230 sends a captured image to a computer system 40, and the computer system 40 processes the image to obtain a three-dimensional tomographic image of the battery.

In the embodiments of this application, neutron imaging is performed each time the battery rotates a given angle, so as to obtain the plurality of two-dimensional tomographic images corresponding to the plurality of orientations of the battery. Neutron imaging is performed while the battery is rotating.

For example, neutron imaging is performed each time the battery rotates 1 degree, that is, neutron imaging is performed 360 times each turn of battery rotation.

In the embodiments of this application, a photographing frequency of the neutron camera can be determined based on a rotation speed of the battery. For example, if the rotation speed of the battery is 6°/s, the photographing frequency of the neutron camera is 6 hertz (Hz).

In other implementations, times of neutron imaging performed in one turn of battery rotation and the photographing frequency may be other values, which are not limited in this application.

In one implementation of the embodiments of this application, the first direction X is perpendicular to the second direction Y, that is, an included angle between the first direction X and the second direction Y is 90°.

In another implementation of the embodiments of this application, an included angle between the first direction X and the second direction Y may be less than 90°.

In the embodiments of this application, the battery is controlled to rotate and neutron imaging is performed during the rotation of the battery, so that a plurality of two-dimensional tomographic images respectively corresponding to a plurality of orientations of the battery can be easily obtained.

Figure 5:
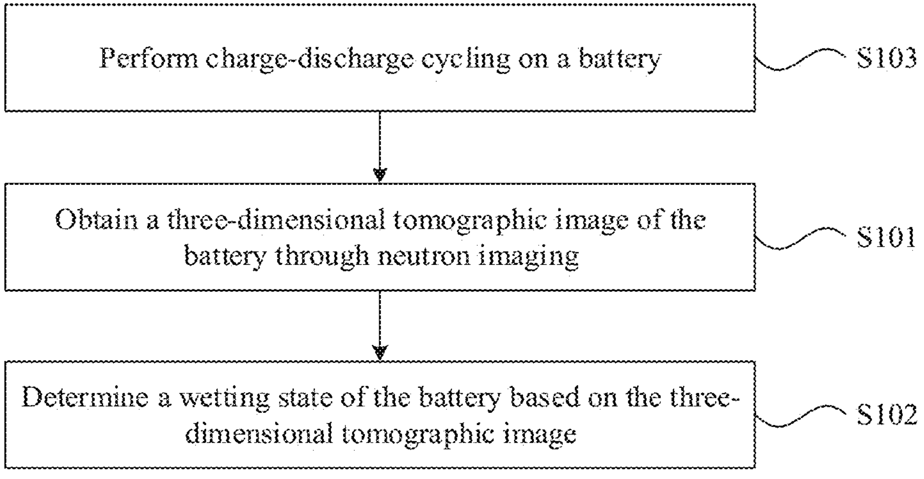
FIG. 5 is a flowchart of a battery wetting state detection method according to some embodiments of this application.

According to some embodiments of this application, FIG. 5 is a flowchart of a battery wetting state detection method according to some embodiments of this application. Referring to FIG. 5, the method further includes the following step.

Step S103: Perform charge-discharge cycling on a battery.

In the embodiments of this application, the charge-discharge cycling is performed on the battery to simulate a charge-discharge process of the battery in actual use. A single cycle of a battery involves one instance of charging and discharging, and it can also be referred to as one turn.

In the embodiments of this application, the charge-discharge cycling is performed on the battery to simulate a charge-discharge process of the battery in actual use, so that the wetting state of the battery in the use process can be detected. In this way, any instances of unqualified battery wetting state can be promptly detected, thus avoiding safety problems and providing some guidance for the safety operation guidelines for the actual use of the battery.

Figure 6:
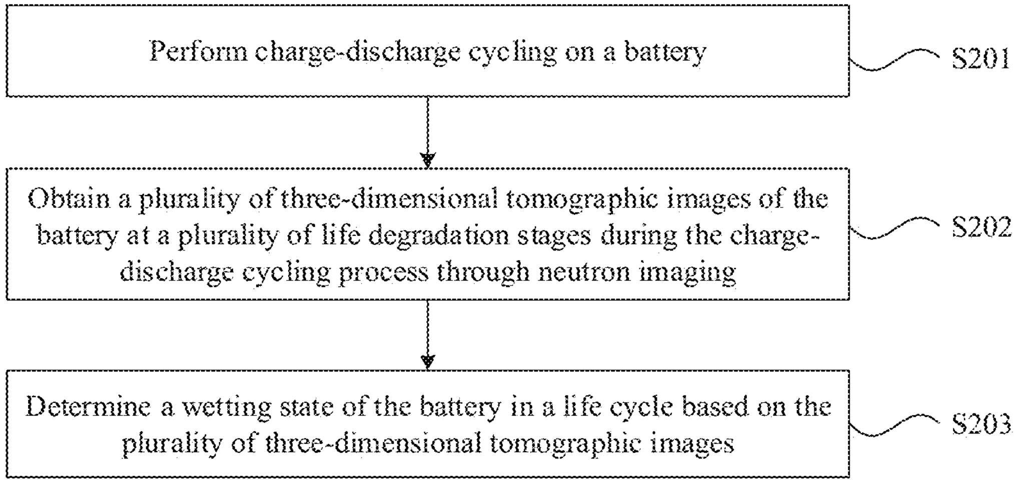
FIG. 6 is a flowchart of a battery wetting state detection method according to some embodiments of this application.

According to some embodiments of this application, FIG. 6 is a flowchart of a battery wetting state detection method according to some embodiments of this application. Referring to FIG. 6, the method includes the following steps.

Step S201: Perform charge-discharge cycling on a battery.

Step S202: Obtain a plurality of three-dimensional tomographic images of the battery at a plurality of life degradation stages during the charge-discharge cycling process through neutron imaging.

Step S203: Determine a wetting state of the battery in a life cycle based on the plurality of three-dimensional tomographic images.

In the embodiments of this application, during the charge-discharge cycling process of the battery, the battery life degrades, and three-dimensional tomographic images at different life degradation stages of the battery can be obtained through neutron imaging, so as to detect the wetting state of the battery in the life cycle. As the wetting state of the battery may change during its use, using this method to determine the wetting state of the battery in the life cycle is beneficial in ensuring subsequent safe operation of the battery during its use.

The life cycle of the battery means the entire stage of the battery from being put into use to end-of-life.

Figure 7:
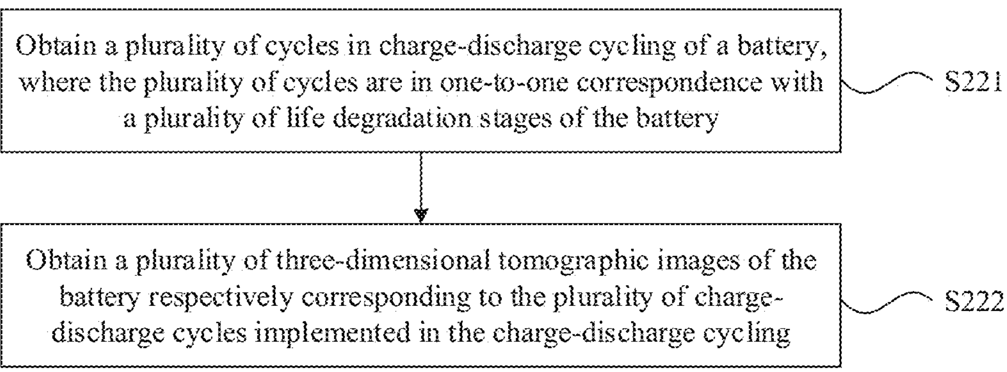
FIG. 7 is a flowchart of a battery wetting state detection method according to some embodiments of this application.

According to some embodiments of this application, FIG. 7 is a flowchart of the battery wetting state detection method according to some embodiments of this application. Referring to FIG. 7, step S202 includes the following steps.

Step S221: Obtain a plurality of cycles in the charge-discharge cycling of the battery, where the plurality of cycles are in one-to-one correspondence with the plurality of life degradation stages of the battery.

Step S222: Obtain a plurality of three-dimensional tomographic images of the battery respectively corresponding to the plurality of charge-discharge cycles implemented in the charge-discharge cycling.

In the embodiments of this application, neutron imaging can be performed once every specified number of cycles of the battery to obtain a three-dimensional tomographic image of the battery at this life degradation stage. The battery life degrades each time charge-discharge cycling is performed on the battery, and each life degradation stage of the battery corresponds to one cycle number.

In the embodiments of this application, the battery can be placed on the turntable 210 each time after the battery has undergone a specified number of cycles, and the turntable 210 is controlled to rotate, during which neutron imaging is performed on the battery using a neutron camera 20 to obtain a three-dimensional tomographic image of the battery at this life degradation stage.

For example, the number of cycles of the battery can be 100, 200, 300 . . . and so on, and neutron imaging is performed each time after the battery has undergone a corresponding number of cycles. That is, neutron imaging is performed once every 100 cycles of the battery.

In other implementations, other cycles can be set. For example, neutron imaging is performed once every 80 cycles of the battery; or neutron imaging is performed once every 120 cycles of the battery.

In the embodiments of this application, each time the battery is charged and discharged, one cycle is completed, and the battery life degrades partly with each cycle of the battery. It is more convenient to determine a life degradation stage of the battery by controlling the number of cycles of the battery.

Figure 8:
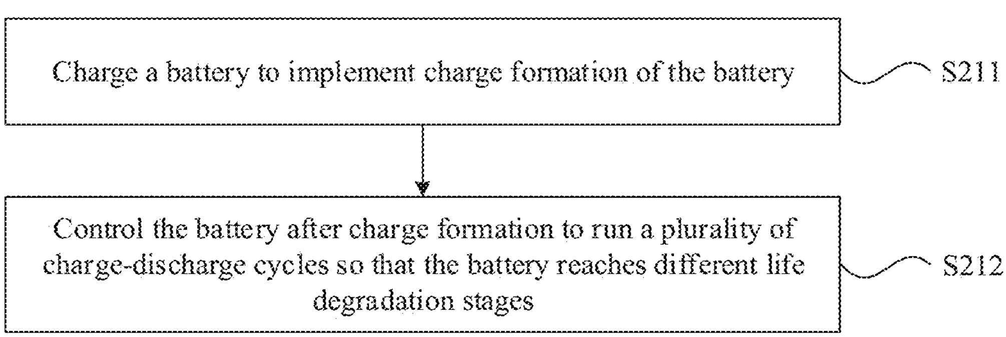
FIG. 8 is a flowchart of a battery wetting state detection method according to some embodiments of this application.

According to some embodiments of this application, FIG. 8 is a flowchart of the battery wetting state detection method according to some embodiments of this application. Referring to FIG. 8, step S201 includes the following steps.

Step S211: Charge the battery to implement charge formation of the battery.

Step S212: Control the battery after charge formation to run a plurality of charge-discharge cycles so that the battery reaches different life degradation stages.

In the embodiments of this application, charge formation means that the battery is charged for the first time to make the battery electrochemically active.

In the embodiments of this application, the battery after charge formation is electrochemically active, facilitating subsequent charge-discharge cycles as well as detection of the wetting state of the battery through neutron imaging.

Figure 9:
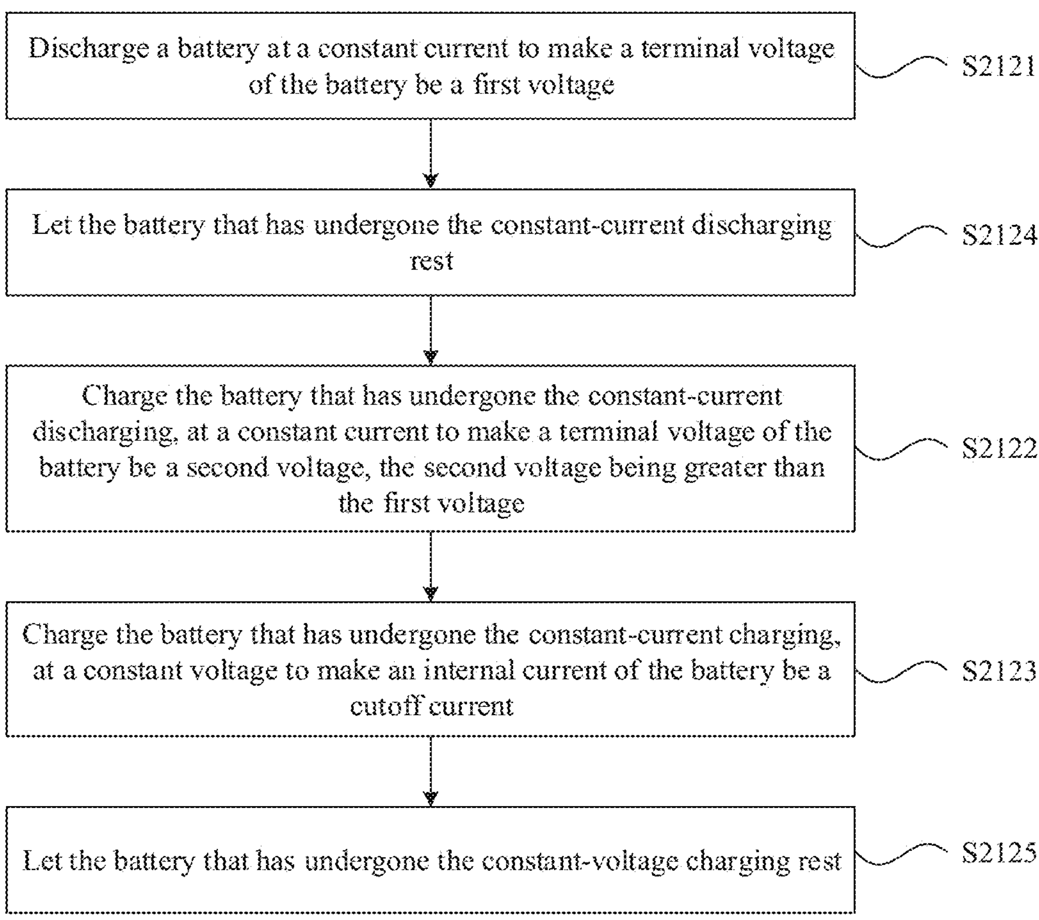
FIG. 9 is a flowchart of a battery wetting state detection method according to some embodiments of this application.

According to some embodiments of this application. FIG. 9 is a flowchart of the battery wetting state detection method according to some embodiments of this application. Referring to FIG. 9, each of the charge-discharge cycles in step S212 includes the following steps.

Step S2121: Discharge the battery at a constant current to make a terminal voltage of the battery be a first voltage.

Step S2122: Charge the battery that has undergone the constant-current discharging, at a constant current to make a terminal voltage of the battery be a second voltage, the second voltage being greater than the first voltage.

Step S2123: Charge the battery that has undergone the constant-current charging, at a constant voltage to make an internal current of the battery be a cutoff current.

In the embodiments of this application, as the battery after charge formation has a specified capacity, the battery is discharged and then charged to implement one cycle. When the battery is discharged at a constant current, its voltage drops, and when it is charged at a constant current, the voltage increases. Therefore, the second voltage is greater than the first voltage. The current values for constant-current charging and discharging, as well as the values of the first and second voltages are related to the performance of the battery and are not specifically limited in this application.

During charging, the battery experiences a polarization effect and has a polarization voltage, which causes it to show a maximum voltage threshold even when the current voltage has not yet reached that level. If charging is stopped at this point, the polarization effect gradually dissipates, allowing the battery to show its true voltage. To avoid this, it is necessary to follow constant-current charging with constant-voltage charging during battery charging. During a constant-voltage charging stage, the current gradually decreases until it reaches a given cutoff current, which is usually a very small value. The small current helps to minimize the polarization effect and ensures that the battery voltage hardly decreases after the charging process is completed, ensuring that the battery charging is completed.

In the embodiments of this application, the battery is charged in two stages. The former stage is referred to as a constant-current charging stage, where a given current is applied. Throughout this charging stage, the current remains constant while the voltage increases with the charging time. The latter stage is referred to as a constant-voltage charging stage. Once the battery voltage reaches a given second voltage, the charging process shifts to constant-voltage charging, which lasts for a specified duration. During this stage, the current gradually decreases until it reaches a given charging cutoff current.

In the embodiments of this application, constant-voltage charging of the battery is carried out, reducing the polarization effect of the battery, with the battery voltage hardly decreasing after the charging is completed, thereby ensuring that the battery charging is completed.

According to some embodiments of this application, a ratio of the cutoff current to a rated charging current is greater than or equal to 0.01 and less than or equal to 0.1. The rated charging current is configured to fully charge the battery to its rated capacity within a preset duration.

In the embodiments of this application, the small cutoff current ensures that the polarization effect is very small and that the voltage of the battery hardly decreases after charging is completed, ensuring that charging is completed. The cutoff current being set within the foregoing range can ensure that the cutoff current is small.

According to some embodiments of this application, referring to FIG. 9 again, each of the charge-discharge cycles in step S212 further includes the following step.

Step S2124: Let the battery that has undergone the constant-current discharging rest.

In the embodiments of this application, after the battery is discharged, the battery is let to rest for a period of time to simulate battery rest in actual use so as to ensure accuracy.

According to some embodiments of this application, referring to FIG. 9 again, each of the charge-discharge cycles in step S212 further includes the following step.

Step S2125: Let the battery that has undergone the constant-voltage charging rest.

In the embodiments of this application, after the battery is charged, the battery is let to rest for a period of time to simulate battery rest in actual use so as to ensure accuracy.

For example, the battery is let to rest when its voltage becomes the second voltage, where an internal current of the battery reaches a cutoff current.

In the embodiments of this application, a charge-discharge cycle is completed once the battery has rested after the constant-voltage charging, and then a next charge-discharge cycle starts.

According to some embodiments of this application, temperature of the battery in each charge-discharge cycle is greater than or equal to 50 degrees Celsius (° C.) and less than or equal to 70° C.

In the embodiments of this application, the charge-discharge cycling of the battery may be performed in a thermostat.

For example, the temperature of the battery in the charge-discharge cycling is 50 degrees Celsius; or the temperature of the battery in the charge-discharge cycling is 60° C.; or the temperature of the battery in the charge-discharge cycling is 70° C.

In the embodiments of this application, limiting the temperature of the battery in the charge-discharge cycling to be greater than or equal to 50° C. and less than or equal to 70° C. can accelerate battery aging, thereby reducing experiment time and improving the operating efficiency.

Figure 10:
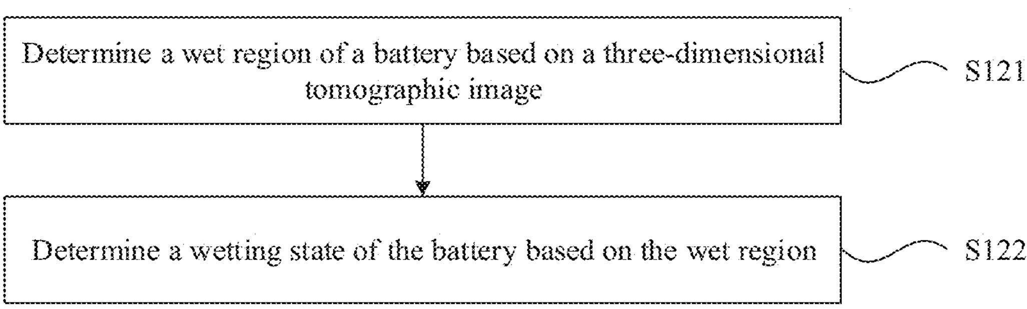
FIG. 10 is a flowchart of a battery wetting state detection method according to some embodiments of this application.

According to some embodiments of this application, FIG. 10 is a flowchart of the battery wetting state detection method according to some embodiments of this application. Referring to FIG. 10, step S102 includes the following steps.

Step S121: Determine a wet region of the battery based on the three-dimensional tomographic image.

Step S122: Determine the wetting state of the battery based on the wet region.

In the embodiments of this application, neutrons react with light elements such as H and Li in the battery, and therefore the wet region of the battery can be clearly determined from the three-dimensional tomographic image, thereby determining the wetting state of the battery.

Figure 11:
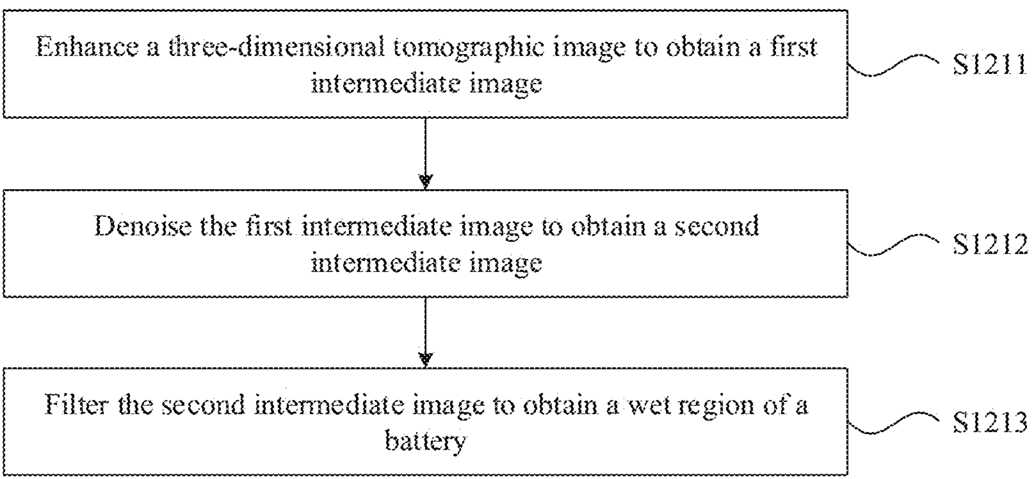
FIG. 11 is a flowchart of a battery wetting state detection method according to some embodiments of this application.

According to some embodiments of this application, FIG. 11 is a flowchart of the battery wetting state detection method according to some embodiments of this application. Referring to FIG. 11, step S121 includes the following steps.

Step S1211: Enhance the three-dimensional tomographic image to obtain a first intermediate image.

Step S1212: Denoise the first intermediate image to obtain a second intermediate image.

Step S1213: Filter the second intermediate image to obtain the wet region of the battery.

In the embodiments of this application, the three-dimensional tomographic image obtained through neutron imaging may contain images of other parts, and therefore the three-dimensional tomographic image is enhanced to make images of a desired part clearer. The first intermediate image may contain images of other parts, and therefore the first intermediate image is denoised to remove the images of other parts. The second intermediate image may contain error images, and therefore the second intermediate image is filtered to remove the error images, making the wet region of the battery obtained more accurate.

Figure 12:
FIG. 12 is a flowchart of a battery wetting state detection method according to some embodiments of this application.
Figure 12:
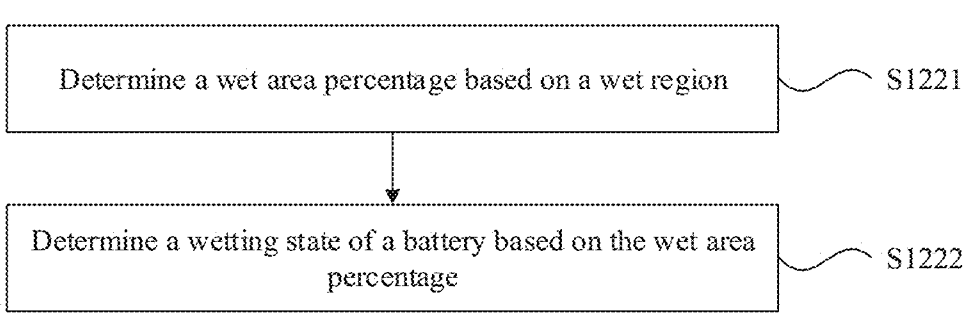

According to some embodiments of this application, FIG. 12 is a flowchart of the battery wetting state detection method according to some embodiments of this application. Referring to FIG. 12, step S122 includes the following steps.

Step S1221: Determine a wet area percentage based on the wet region.

Step S1222: Determine the wetting state of the battery based on the wet area percentage.

In the embodiments of this application, after the wet region of the battery is determined, the wet area percentage can be determined based on a ratio of an actual wet region to a theoretical wet region. A larger wet area percentage indicates a better wetting state of the battery. The wetting state of the battery can be quickly determined based on the wet area percentage of the battery.

Figure 13:
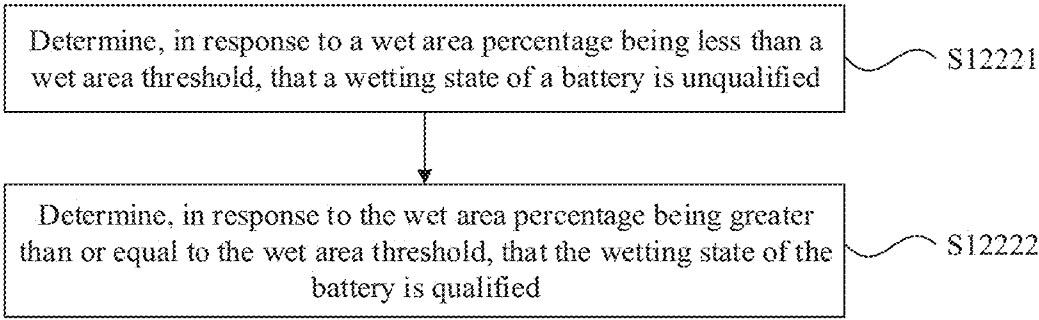
FIG. 13 is a flowchart of a battery wetting state detection method according to some embodiments of this application.

According to some embodiments of this application, FIG. 13 is a flowchart of the battery wetting state detection method according to some embodiments of this application. Referring to FIG. 13, step S1222 includes the following steps.

Step S12221: Determine, in response to the wet area percentage being less than a wet area threshold, that the wetting state of the battery is unqualified.

Step S12222: Determine, in response to the wet area percentage being greater than or equal to the wet area threshold, that the wetting state of the battery is qualified.

For example, the wet area threshold is 1.

In the embodiments of this application, the wet area threshold is determined first, and then the wetting state of the battery is determined by comparing the wet area percentage with the wet area threshold. With such a simple judgment criterion, the wetting state of the battery can be quickly determined.

Figure 14:
FIG. 14 is a block diagram of a battery wetting state detection apparatus according to some embodiments of this application.
Figure 14:
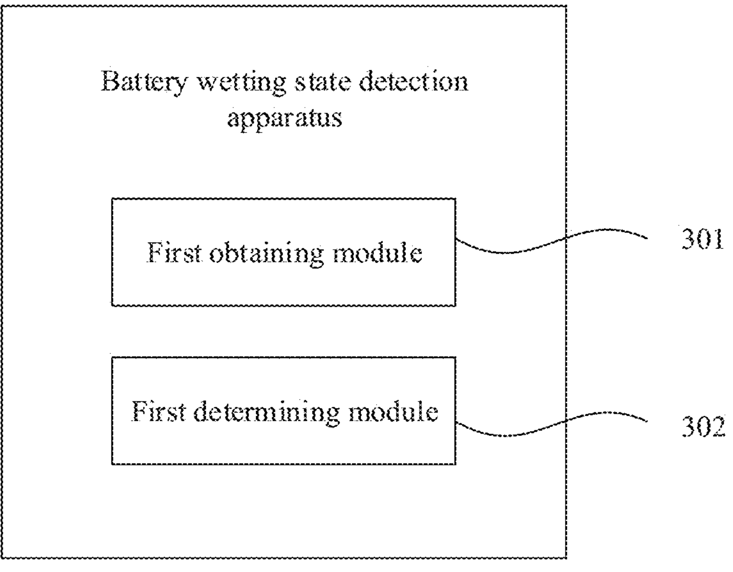

According to some embodiments of this application, FIG. 14 is a block diagram of a battery wetting state detection apparatus according to some embodiments of this application. Referring to FIG. 14, the apparatus includes:

- a first obtaining module 301 configured to obtain a three-dimensional tomographic image of a battery through neutron imaging, and
- a first determining module 302 configured to determine a wetting state of the battery based on the three-dimensional tomographic image.

According to some embodiments of this application, the first obtaining module 301 includes: a first obtaining unit configured to obtain a plurality of two-dimensional tomographic images corresponding to a plurality of orientations of the battery through neutron imaging; and a second obtaining unit configured to obtain the three-dimensional tomographic image based on the plurality of two-dimensional tomographic images.

According to some embodiments of this application, the first obtaining unit includes: a first control subunit configured to control the battery to rotate, where a rotation axis of the battery is located between two electrode terminals of the battery, and the rotation axis extends in a first direction; and a second control subunit configured to control a neutron camera to photograph the rotating battery at a given frequency in a second direction to obtain the plurality of two-dimensional tomographic images respectively corresponding to the plurality of orientations of the battery; where the second direction intersects with the first direction.

According to some embodiments of this application, the apparatus further includes a first control module configured to perform charge-discharge cycling on the battery.

According to some embodiments of this application, the apparatus further includes: a second obtaining module configured to obtain a plurality of three-dimensional tomographic images of the battery at a plurality of life degradation stages during the charge-discharge cycling process through neutron imaging; and a second determining module configured to determine a wetting state of the battery in a life cycle based on the plurality of three-dimensional tomographic images.

According to some embodiments of this application, the second obtaining module includes: a third obtaining unit configured to obtain a plurality of cycles in the charge-discharge cycling of the battery, where the plurality of cycles are in one-to-one correspondence with the plurality of life degradation stages of the battery; and a fourth obtaining unit configured to obtain a plurality of three-dimensional tomographic images of the battery respectively corresponding to the plurality of charge-discharge cycles implemented in the charge-discharge cycling.

According to some embodiments of this application, the first control module includes: a first control unit configured to charge the battery to implement charge formation of the battery; a second control unit configured to control the battery after charge formation to run a plurality of charge-discharge cycles so that the battery reaches different life degradation stages.

According to some embodiments of this application, the second control unit is configured to: discharge the battery at a constant current to make a terminal voltage of the battery be a first voltage; charge the battery that has undergone the constant-current discharging, at a constant current to make a terminal voltage of the battery be a second voltage, the second voltage being greater than the first voltage; and charge the battery that has undergone the constant-current charging, at a constant voltage to make an internal current of the battery be a cutoff current.

According to some embodiments of this application, the second control unit is further configured to: let the battery that has undergone the constant-current discharging rest.

According to some embodiments of this application, the second control unit is further configured to: let the battery that has undergone the constant-voltage charging rest.

According to some embodiments of this application, temperature of the battery in each charge-discharge cycle is greater than or equal to 50 degrees Celsius and less than or equal to 70 degrees Celsius.

According to some embodiments of this application, the first determining module 302 includes: a first determining unit configured to determine a wet region of the battery based on the three-dimensional tomographic image; and a second determining unit configured to determine the wetting state of the battery based on the wet region.

According to some embodiments of this application, the first determining unit includes: a first processing subunit configured to enhance the three-dimensional tomographic image to obtain a first intermediate image; a second processing subunit configured to denoise the first intermediate image to obtain a second intermediate image; and a third processing subunit configured to filter the second intermediate image to obtain the wet region of the battery.

According to some embodiments of this application, the second determining unit includes: a third determining subunit configured to determine a wet area percentage based on the wet region; and a fourth determining subunit configured to determine the wetting state of the battery based on the wet area percentage.

According to some embodiments of this application, the fourth determining subunit is configured to determine, in response to the wet area percentage being less than a wet area threshold, that the wetting state of the battery is unqualified; and determine, in response to the wet area percentage being greater than or equal to the wet area threshold, that the wetting state of the battery is qualified.

According to some embodiments of this application, an electronic device is provided. The electronic device includes at least one processor or circuitry and a memory communicatively connected to the at least one processor. The memory stores instructions executable by the at least one processor, and the instructions are executed by the at least one processor to enable the at least one processor or circuitry to perform the battery wetting state detection method according to any one of the foregoing embodiments.

Some embodiments of this application provide a battery management system including the electronic device in the foregoing embodiments.

Some embodiments of this application provide a non-transitory computer readable storage medium storing a computer program. When the computer program is executed by a processor, the battery wetting state detection method according to any one of the foregoing embodiments is implemented. For example, the non-transitory computer readable storage medium may be a ROM, a random access memory (RAM), a CD-ROM, a magnetic tape, a floppy disk, an optical data storage device, or the like.

Some embodiments of this application provide a computer program product including a computer program. When the computer program is executed by a processor, the battery wetting state detection method according to any one of the foregoing embodiments is implemented. The computer program product includes one or more computer instructions. When these computer instructions are loaded and executed on a computer, part or all of the foregoing method may be implemented according to part of all of the flow or functions in the embodiments of this application.

Figure 15:
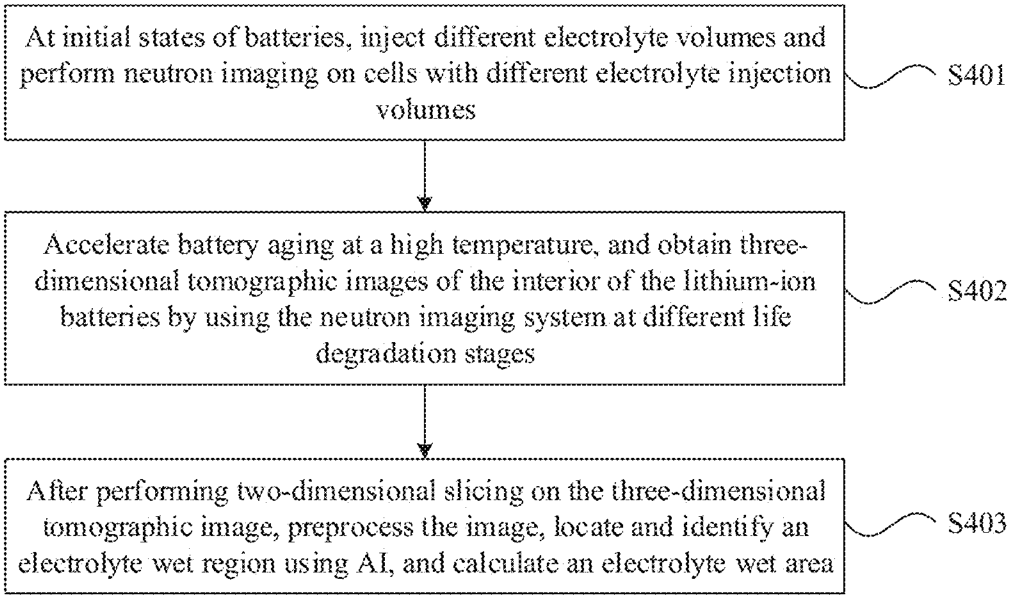
FIG. 15 is a flowchart of a battery wetting state detection method according to some embodiments of this application.

The battery wetting state detection method in the embodiments of this application is illustrated by using a lithium iron phosphate LiFePO4 lithium battery as an example. FIG. 15 is a flowchart of the battery wetting state detection method according to some embodiments of this application. Referring to FIG. 15, the method includes the following steps.

Step S401: At initial states of batteries, inject different electrolyte volumes and perform neutron imaging on cells with different electrolyte injection volumes.

For example, the step S401 includes the following steps.

Step 1: Separate a positive electrode plate from a negative electrode plate with a separator, weld positive and negative tabs to fabricate a bare cell, and wrap the bare cell into a housing to make a preassembled cell.

Step 2: Inject 0%, 20%, 33%, 50%, and 100% of a standard electrolyte injection volume into the preassembled cells respectively, and seal the cells.

Step 3: According to a standard process of production line, perform charge formation on the batteries having different wetting conditions for formation.

Step 4: Carry out neutron imaging on the cells after formation having different electrolyte injection volumes to obtain three-dimensional tomographic images of the lithium-ion batteries.

For example, 13 LiFePO4 square lithium batteries with a capacity of 177 Ah are selected, out of which 2 are filled with no electrolyte, 2 with 20% of the standard electrolyte injection volume, 2 with 33% of the standard electrolyte injection volume, 2 with 50% of the standard electrolyte injection volume, and 5 with 100% of the standard electrolyte injection volume; then the batteries are subjected to charge formation according to the standard process of the production line; and neutron imaging is carried out for the 2 samples with no electrolyte, 2 samples with 20% of the standard electrolyte injection volume, 2 samples with 50% of the standard electrolyte injection volume, and 2 samples with 100% of the standard electrolyte injection volume to obtain three-dimensional tomographic images of the lithium-ion batteries.

In the embodiments of this application, whether the neutron imaging method is feasible can be determined by comparing the three-dimensional tomographic images for different electrolyte injection volumes.

For example, the three-dimensional tomographic images for different electrolyte injection volumes being all different indicates that the neutron imaging method is feasible; the three-dimensional tomographic images for different electrolyte injection volumes being all the same indicates that the neutron imaging method is unfeasible.

Step S402: Accelerate battery aging at a high temperature, and obtain three-dimensional tomographic images of the interior of the lithium-ion batteries by using a neutron imaging system at different life degradation stages.

For example, cyclic testing is carried out on three samples with 100% of the standard electrolyte volume to accelerate aging.

For example, specific steps in a life acceleration test for the lithium-ion battery are as follows: Firstly, the lithium battery is placed in a 60° C. thermostat, and the battery is discharged to 2.5 V at a constant current of 1 C and let to rest for 1 hour. Then, the battery is charged to 3.65 V at a constant current of 1 C, and then charged at a constant voltage; charging is stopped when the charging current drops to 0.05 C; and the battery is let to rest for 1 hour. The foregoing steps are repeated for N cycles, where N=100, 200, 300 . . . ; and neutron imaging is performed every 100 cycles.

Step S403: After performing two-dimensional slicing on the three-dimensional tomographic image, preprocess the image, locate and identify an electrolyte wet region using artificial intelligence (Artificial Intelligence, AI), and calculate an electrolyte wet area.

In the embodiments of this application, the charge rate is a measure of charging speed, and charge rate=charging current/rated capacity of the battery. For example, 1 C means that it takes 1/1=1 hour to charge the battery with this current until the battery is fully charged; 0.05 C means that it takes 1/0.05=20 hours to charge the battery with this current, and correspondingly the 0.05 C current is the cut-off current.

For example, the step S403 includes the following steps.

Step 1: Reconstruct a neutron three-dimensional image, where a three-dimensional structure is reconstructed based on neutron imaging data of samples in different states.

Step 2: Slice the three-dimensional structure image to obtain the front view, side view, and top view of the full depth of the sample.

Step 3: First extract a two-dimensional image to be analyzed; then dynamically enhance and denoise the image; then filter the image; then locate a to-be-detected region using AI; then identify an electrolyte wet region using AI (based on the gray-scale leap of the imaging picture); then automatically measure the wet area; and finally label NG for poor wetting.

For example, the AI automatic identification system can identify the wet area of the cell and automatically alarm the unqualified wet products. A sample with a wet area <100% is determined as an abnormal product.

In conclusion, it should be noted that the above embodiments are merely intended for describing the technical solutions of this application but not for limiting this application. Although this application is described in detail with reference to the foregoing embodiments, persons of ordinary skill in the art should understand that they may still make modifications to the technical solutions described in the foregoing embodiments or make equivalent replacements to some or all technical features thereof without departing from the scope of the technical solutions of the embodiments of this application. They should all be covered in the scope of claims and summary in this application. In particular, as long as there is no structural conflict, the various technical features mentioned in the embodiments can be combined in any manners. This application is not limited to the specific embodiments disclosed in this specification, but includes all technical solutions falling within the scope of the claims.

The invention claimed is:

1. A battery wetting state detection method, the method comprising:

obtaining a plurality of three-dimensional tomographic battery cell images;

determining the plurality of three-dimensional tomographic battery cell images are from a plurality of battery cells having different electrolyte injection volumes;

determining the battery wetting state detection method is feasible in response to the plurality of three-dimensional tomographic battery cell images being all different based on the different electrolyte injection volumes;

obtaining a three-dimensional tomographic image of a battery from obtaining circuitry configured to obtain the three-dimensional tomographic image through neutron imaging; and determining a wet region of the battery based on the three-dimensional tomographic image, the determining of the wet region of the battery comprises:

enhancing the three-dimensional tomographic image to obtain a first intermediate image;

denoising the first intermediate image to obtain a second intermediate image; and filtering the second intermediate image to obtain the wet region of the battery;

determining a wet area percentage based on a ratio of the wet region to a theoretical wet region; and determining a wetting state of the battery from determining circuitry configured to determine the wetting state of the battery based on the wet area percentage, the determining of the wetting state of the battery comprises:

determining, in response to the wet area percentage being less than a wet area threshold, that the wetting state of the battery is unqualified; and determining, in response to the wet area percentage being greater than or equal to the wet area threshold, that the wetting state of the battery is qualified.

2. The method according to claim 1, the obtaining the three-dimensional tomographic image of the battery from the obtaining circuitry through neutron imaging comprising:

obtaining a plurality of two-dimensional tomographic images respectively corresponding to a plurality of orientations of the battery through neutron imaging; and obtaining the three-dimensional tomographic image based on the plurality of two-dimensional tomographic images.

3. The method according to claim 2, the obtaining a plurality of two-dimensional tomographic images respectively corresponding to a plurality of orientations of the battery comprising:

controlling the battery to rotate, wherein a rotation axis of the battery is located between two electrode terminals of the battery, and the rotation axis extends in a first direction; and controlling a neutron camera to photograph the rotating battery at a given frequency in a second direction to obtain the plurality of two-dimensional tomographic images respectively corresponding to the plurality of orientations of the battery, wherein the second direction intersects with the first direction.

4. The method according to claim 1, before the obtaining the three-dimensional tomographic image of the battery from the obtaining circuitry through neutron imaging, the method further comprising:

performing a charge-discharge cycling process on the battery.

5. The method according to claim 4, the method further comprising:

obtaining a plurality of three-dimensional tomographic images of the battery at a plurality of life degradation stages during the charge-discharge cycling process through neutron imaging; and determining the wetting state of the battery in a life cycle based on the plurality of three-dimensional tomographic images.

6. The method according to claim 5, the obtaining the plurality of three-dimensional tomographic images of the battery at the plurality of life degradation stages during the charge-discharge cycling process comprising:

obtaining a plurality of cycles in the charge-discharge cycling of the battery, wherein the plurality of cycles are in one-to-one correspondence with the plurality of life degradation stages of the battery; and obtaining the plurality of three-dimensional tomographic images of the battery respectively corresponding to the plurality of charge-discharge cycles implemented in the charge-discharge cycling.

7. The method according to claim 4, the performing charge-discharge cycling on the battery comprising:

charging the battery to implement charge formation of the battery; and controlling the battery after the charge formation to run a plurality of charge-discharge cycles so that the battery reaches different life degradation stages.

8. The method according to claim 7, each of the charge-discharge cycles comprising:

discharging the battery at a constant current to make a terminal voltage of the battery be a first voltage;

charging the battery that has undergone the constant-current discharging, at a constant current to make a terminal voltage of the battery be a second voltage, the second voltage being greater than the first voltage; and charging the battery that has undergone the constant-current charging, at a constant voltage to make an internal current of the battery be a cutoff current.

9. The method according to claim 8, before the charging, at a constant current, the battery that has undergone the constant-current discharging, each of the charge-discharge cycles further comprising:

letting the battery that has undergone the constant-current discharging rest.

10. The method according to claim 8, each of the charge-discharge cycles further comprising:

letting the battery that has undergone the constant-voltage charging rest.

11. The method according to claim 8, wherein:

a ratio of the cutoff current to a rated charging current is greater than or equal to 0.01 and less than or equal to 0.1.

12. The method according to claim 4, the method further comprising:

during each charge-discharge cycle the battery maintains a temperature being greater than or equal to 61 degrees Celsius and less than or equal to 70 degrees Celsius.

13. A non-transitory computer readable storage medium storing a computer program, wherein when the computer program is executed by a processor, the battery wetting state detection method according to claim 1 is implemented.

14. The method according to claim 1, wherein the obtaining the plurality of three-dimensional tomographic battery cell images comprises:

injecting the different electrolyte injection volumes into a plurality of preassembled battery cells, respectively, the different electrolyte injection volumes including 0%, 20%, 33%, 50%, and 100% of a standard electrolyte injection volume;

performing charge formation on the plurality of battery cells having the different electrolyte injection volumes; and performing the neutron imaging on the plurality of battery cells after the charge formation to obtain the plurality of three-dimensional tomographic battery cell images.

15. The method according to claim 1, further comprising:

performing the neutron imaging with a neutron camera, the neutron camera including a turntable, a reflector, and an image acquisition apparatus, wherein the neutron camera emits neutrons to the battery in response to the turntable rotating the battery, and the reflector reflects the neutrons to the image acquisition apparatus after the neutrons have passed through the battery.

16. A battery wetting state detection apparatus, the apparatus comprising:

obtaining circuitry configured to obtain a plurality of three-dimensional tomographic battery cell images and a three-dimensional tomographic image of a battery through neutron imaging; and determining circuitry configured to:

determine the plurality of three-dimensional tomographic battery cell images are from a plurality of battery cells having different electrolyte injection volumes;

determine battery wetting state detection of the battery wetting state detection apparatus is feasible in response to the plurality of three-dimensional tomographic battery cell images being all different based on the different electrolyte injection volumes;

determine a wet region of the battery based on the three-dimensional tomographic image by:

enhancing the three-dimensional tomographic image to obtain a first intermediate image;

denoising the first intermediate image to obtain a second intermediate image; and filtering the second intermediate image to obtain the wet region of the battery;

determine a wet area percentage based on a ratio of the wet region to a theoretical wet region; and determine a wetting state of the battery based on the wet area percentage, the determining of the wetting state of the battery comprises:

determine, in response to the wet area percentage being less than a wet area threshold, that the wetting state of the battery is unqualified; and determine, in response to the wet area percentage being greater than or equal to the wet area threshold, that the wetting state of the battery is qualified.

17. The battery wetting state detection apparatus according to claim 16, further comprising:

a neutron camera to perform the neutron imaging, the neutron camera including a turntable, a reflector, and an image acquisition apparatus, wherein the neutron camera emits neutrons to the battery in response to the turntable rotating the battery, and the reflector reflects the neutrons to the image acquisition apparatus after the neutrons have passed through the battery.

18. An electronic device, the electronic device comprising:

at least one processor; and a memory communicatively connected to the at least one processor; wherein the memory stores instructions executable by the at least one processor, and the instructions are executed by the at least one processor to enable the at least one processor to perform a battery wetting state detection method, the method comprising:

obtaining a plurality of three-dimensional tomographic battery cell images;

determining the plurality of three-dimensional tomographic battery cell images are from a plurality of battery cells having different electrolyte injection volumes;

determining the battery wetting state detection method is feasible in response to the plurality of three-dimensional tomographic battery cell images being all different based on the different electrolyte injection volumes;

obtaining a three-dimensional tomographic image of a battery from obtaining circuitry configured to obtain the three-dimensional tomographic image through neutron imaging; and determining a wet region of the battery based on the three-dimensional tomographic image, the determining of the wet region of the battery comprises:

enhancing the three-dimensional tomographic image to obtain a first intermediate image;

denoising the first intermediate image to obtain a second intermediate image; and filtering the second intermediate image to obtain the wet region of the battery;

determining a wet area percentage based on a ratio of the wet region to a theoretical wet region; and determining a wetting state of the battery from determining circuitry configured to determine the wetting state of the battery based on the wet area percentage, the determining of the wetting state of the battery comprises:

determining, in response to the wet area percentage being less than a wet area threshold, that the wetting state of the battery is unqualified; and determining, in response to the wet area percentage being greater than or equal to the wet area threshold, that the wetting state of the battery is qualified.

19. A battery management system, comprising the electronic device according to claim 18.

* * * * *